United States Patent [19]

Trayes

[11] 4,009,785
[45] Mar. 1, 1977

[54] FIXTURE AND SYSTEM FOR HANDLING PLATE LIKE OBJECTS

[75] Inventor: Terence John Trayes, Phoenix, Ariz.

[73] Assignee: Motorola, Inc., Chicago, Ill.

[22] Filed: Oct. 2, 1974

[21] Appl. No.: 511,324

[52] U.S. Cl. .......................... 214/1 BT; 294/64 B; 302/2 R

[51] Int. Cl.² ........................................ B65G 53/50

[58] Field of Search ............. 294/64 R, 64 A, 64 B; 214/1 BS, 1 BT, 1 BH, 1 BV, 8.5 D, 6 FS; 302/31, 2 R

[56] References Cited

UNITED STATES PATENTS

| | | | |
|---|---|---|---|
| 3,039,623 | 6/1962 | Sehn et al. ........................ | 214/1 BT |
| 3,318,468 | 5/1967 | Olson ............................ | 294/64 R X |
| 3,425,736 | 2/1969 | Benjamin ........................ | 294/64 R |
| 3,438,668 | 4/1969 | Olsson ............................ | 294/64 R |
| 3,645,581 | 2/1972 | Lasch, Jr. et al. ............. | 214/1 BT X |
| 3,857,496 | 12/1974 | Gonzales ......................... | 214/1 BT |

FOREIGN PATENTS OR APPLICATIONS

| | | | |
|---|---|---|---|
| 111,810 | 9/1967 | Norway ........................... | 294/64 R |
| 120,289 | 9/1970 | Norway ........................... | 294/64 R |

Primary Examiner—Frank E. Werner
Attorney, Agent, or Firm—Kenneth R. Stevens

[57] ABSTRACT

A system for handling plate like objects (e.g., semiconductor wafers) includes a gas actuated fixture having a surface for releasably picking up the plate like objects (e.g., by Bernoulli effect). Means is provided for moving the pickup fixture in a plane of motion from a first to second position. Means forming a part of the pickup fixture (e.g., a selectively pressured bellows) moves the pickup surface orthogonally to the plane of motion. An air track or other conveyer for the plate like objects includes means for restraining the objects beneath the first position. Means for positioning successive locations of a carrier for the plate like objects positions the successive locations beneath the second position. In operation, the system picks up the plate like objects from the conveyer, loads them onto the carrier, then unloads them from the carrier and returns them to the conveyer, all without subjecting the objects to human contamination.

15 Claims, 3 Drawing Figures

FIXTURE AND SYSTEM FOR HANDLING PLATE LIKE OBJECTS

FIELD OF THE INVENTION

This invention relates to a fixture and system for handling plate like objects, more particularly to such a fixture and system for handling plate like objects having at least one surface subject to damage to contact. Most especially, the invention relates to a fixture and system for handling semiconductor wafers on an automatic basis without damaging them.

DESCRIPTION OF THE PRIOR ART

The fabrication of semiconductor devices has developed as a labor intensive, batch process in which batches of semiconductor wafers are transferred from process unit to process unit manually. Such manual transfers subject the wafers to damage by human contamination or breakage. Recently, a great deal of interest has developed in automated process lines in which a continuous process is carried out, with the semiconductor wafers being transferred from process unit to process unit by air track or slide conveyors in which the semiconductor wafers are suspended above and propelled along the conveyor track by air jets, and pass through the process unit on a continuous basis for processing. Such an in line automated process line has great potential for minimizing contamination and breakage losses due to manual handling. However, such an in line continuous processing scheme is primarily of value for very high volume production of the same or similar devices under essentially identical process conditions. Where a high degree of process flexibility is required, batch processing is generally more efficient than continuous processing.

In a batch processing mode, it still would be desirable to use the air slide conveyers for transporting the wafers from process unit to process unit. To do so, it is often required to load the wafer from the air slide onto carriers, such as susceptors for epitaxial deposition, in order to load them into the process unit, then unload them from the carriers and return them to the air slide for transport to another process unit. In order to employ air slides to their fullest advantage in preventing contamination or breakage of the semiconductor wafers, there remains a need to develop handling fixtures and systems, particularly those capable of picking the wafers up from an air slide, loading them onto a carrier, then returning them from a carrier to the air slide.

While pickup devices for semiconductor wafers which utilize the Bernoulli effect are known, they have not hitherto been used to transfer semiconductor wafers from an air slide in an automated mode.

SUMMARY OF THE INVENTION

Accordingly, it is an object of this invention to provide a fixture and system of simplified construction which is capable of picking up the semiconductor wafers or other plate like objects from an air slide or other conveyer, moving them to a carrier, loading them into the carrier, and subsequently unloading them from the carrier and returning them to the conveyer, all without subjecting the semiconductor wafers or other plate like objects to human contamination or breakage.

It is another object of the invention to provide a fixture for handling plate like objects of simplified construction which may be positioned over one of the objects to be picked up, then a portion of the fixture lowered to pick up the object.

It is still another object to provide an apparatus for handling plate like objects including a fixture for releasably grasping the objects in which the fixture is able to pick up the objects from a first location, move them to a second location and release them, all with movement of the fixture in a single plane of motion.

It is yet another object of the invention to provide a fixture for releasably grasping plate like objects subject to damage by contact in which the objects are confined to a predetermined area of the fixture without damaging them.

The attainment of these and related objects may be achieved through use of the novel fixture and system herein disclosed. The fixture in accordance with the invention is gas actuated and has a surface for releasably picking up the plate like objects. While the fixture can be a vacuum pick up, it is preferred to utilize the Bernoulli effect to pick up the objects, so that an object does not actually contact the pickup surface when it is picked up. In the system, means is provided for moving the pickup fixture in a plane of motion from a first to a second position, corresponding to a pickup station on an air slide and a release station, such as a predetermined position below which successive portions of a receiving member are indexed, respectively. Means forming a part of the pickup fixture moves the pickup surface orthogonally to the plane of motion of the pickup fixture between the pickup station on the air slide conveyer and the receiving member. Preferably, the fixture additionally has a plurality of retractable members extending from the pickup surface of the fixture and enclosing an area of the surface which receives the semiconductor wafer or plate like object. Since these members are retractable, if one of them should contact the semiconductor wafer, it retracts rather than damaging the wafer. In the case of a receiving member susceptible to damage, such as a graphite susceptor, damage to the receiving member is prevented on the same basis.

The attainment of the above and related advantages, objects and features of the invention should be readily apparent after review of the following more detailed description of the invention, taken in conjunction with the accompanying drawing in which:

DETAILED DESCRIPTION OF THE INVENTION

Figure 1:
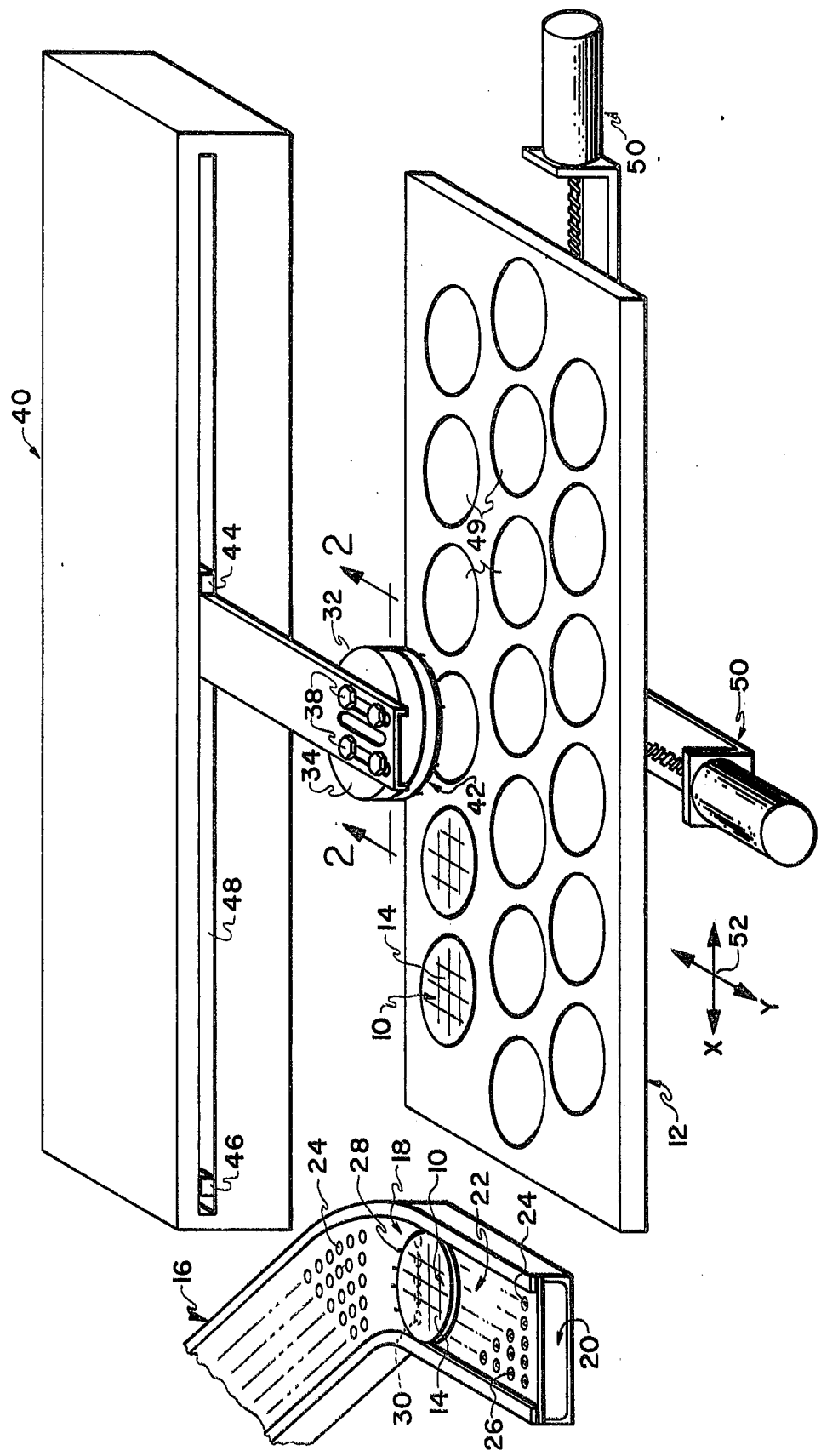
FIG. 1 is a perspective view of a fixture and system in accordance with the invention.

Turning now to the drawings, more particularly to FIG. 1, a pickup fixture and associated system suitable for picking up semiconductor wafers 10 and loading them onto a graphite susceptor 12 is shown. While this embodiment is specifically intended for use in handling semiconductor wafers, it should be apparent that the features of this invention should make it suited for handling a wide variety of other plate like objects, particularly others having at least one surface liable to damage by contact, as well. Top surface 14 of the semiconductor wafers 10 contains an array of integrated circuits or other semiconductor devices, either completed or partially fabricated. It is this surface which is liable to damage by contact, although touching it gently is permissible.

An air slide conveyer 16 is utilized to bring the semiconductor wafers 10 to a pickup station indicated generally at 18. The air slide conveyer 16 has a plenum 20 and a top plate 22 having apertures 24 extending through it to the plenum 20. Air is supplied under pressure to plenum 20 and exits through apertures 24 in the form of jets 26, which suspend the wafer 10 slightly above top plate 22 and propel it along the track, all in a manner known in the art.

Pickup station 18 has a plurality of pins 28, which may be extended above the surface of top plate 22, such as by use of a solenoid (not shown), when it is desired to pick up a wafer 10. It is preferred to provide a plurality of vacuum stops 30, as shown in dotted lines, in the top plate 22 of air slide 16 for the purpose of stopping or slowing down a wafer 10 by contacting its back surface before it impinges against pins 28, in order to avoid chipping or otherwise damaging the wafer edges.

A pickup fixture in accordance with the invention is indicated generally by the reference number 32. The pickup fixture has an upper member 34 and a lower member 36. Upper member 34 is fastened to support arm 36 by means of bolts 38. Support arm 36 is connected to a suitable horizontal reciprocal drive means (not shown), contained within housing 40. A double ended piston and cylinder connected to a drive cable, or a screw drive may be employed for this purpose. The drive should be capable of moving the pickup fixture between pickup station 18 and the position 42, where the pickup fixture 32 is shown, for releasing the semiconductor wafers 10 to susceptor 12. In order to position the pickup head 32 at each end of its path of travel, stop members 44 and 46 are provided in slot 48.

As arm 36 carrying pickup fixture 32 travels between stops 44 and 46, it describes a horizontal plane of motion. Lower member 36 of pickup fixture 32 is movable away from and toward upper member 34, as will be more fully explained with respect to FIG. 2. Movement of the lower member 36 away from upper member 34 perpendicular to the horizontal plane of motion of arm 36 allows simple horizontal motion of arm 36 to position the fixture 32 at positions 18 and 42, with motion of the lower member 36 allowing pickup of a semiconductor wafer 10 and positioning of it for release.

Graphite susceptor 12 has a plurality of recesses 49 in its surface, each dimensioned to receive a semiconductor wafer 10. A conventional x-y positioning mechanism 50 serves to position the recesses 49 successively beneath position 42. Positioning mechanism 50 moves the susceptor 12 in the x and y directions, as shown by arrows 52. Alternatively, the pickup fixture could be successively positioned above each of the recesses 49 by stepping it along the susceptor, and stopping it above each recess by using a row of preprogrammed solenoid operated stops. However, using an x-y positioning mechanism for the susceptor 12 represents a simpler approach.

Figure 2:
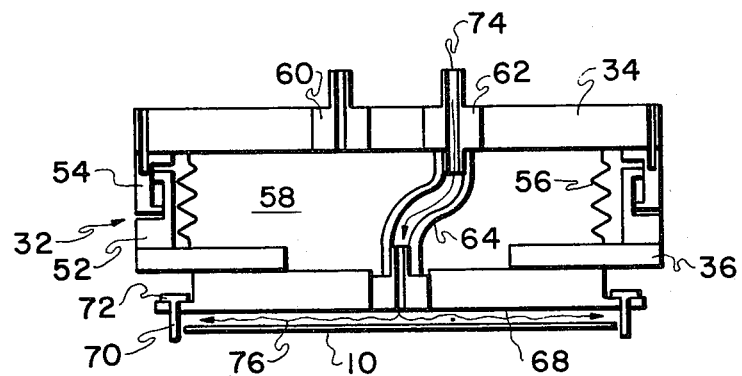
FIG. 2 is a cross section view of a fixture in accordance with the invention, taken along the line 2—2 in FIG. 1.
Figure 2A:
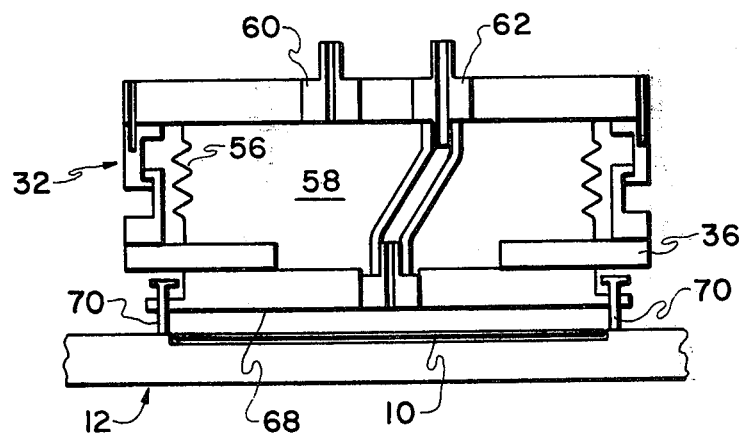
FIG. 2A is a cross section view similar to that in FIG. 2, but with the fixture in semiconductor wafer pickup or release configuration.

FIGS. 2 and 2A show details of the pickup fixture 32 and its method of operation. The fixture 32 has an upper cylindrical member 34 and a lower cylindrical member 36. Sides 52 of the lower cylindrical member 36 interlock with sides 54 of the upper cylindrical member 34. To permit assembly, both cylinders are split vertically on their longitudinal axes. Thin walled, stainless steel bellows 56 joins the upper and lower cylindrical members 34 and 36 to form a sealed chamber 58. Inlet fitting 60 allows air or other fluid to be applied under pressure to chamber 58. Gas inlet 62 supplies gas via tube 64 to orifice 66 in pickup surface 68 of the fixture. Pins 70 extend from pickup surface 68 to surround the semiconductor wafer 10 in position next to pickup surface 68, in order to prevent movement of the wafer 10 off center on pickup surface 68 after it has been picked up. Pins 70 are joined to a ring shaped collar 72 to support them in the position shown.

FIGS. 2 and 2A show how the pickup fixture 32 operates to pick up and release a semiconductor wafer 10. To pick up a semiconductor wafer 10 from pickup station 18 shown in FIG. 1, pickup fixture 32 is positioned against stop 46 by moving support arm 36 to the left. Pickup surface 68 of the fixture 32 is lowered to close proximity to wafer 10 by supplying compressed air to chamber 58 through fitting 60, causing bellows 56 to expand and give the fixture 32 the configuration shown in FIG. 2A. Nitrogen or other gas is then delivered in a downward direction, as indicated by arrows 74, through flexible plastic tube 64 and exits through orifice 66, as shown by arrows 76. With pickup surface 68 in close proximity to semiconductor wafer 10, a reduction in pressure between the wafer 10 and pickup surface 68 causes the wafer to be held in equilibrium suspended slightly beneath pickup surface 68, in accordance with the known Bernoulli effect.

Pickup fixture 32, with the semiconductor wafer 10 in position as shown in FIG. 2, is then moved to position 42 shown in FIG. 1 by moving support arm 36 to the right against stop 44, as shown in FIG. 1. Release of the semiconductor wafer 10 is accomplished by first moving lower cylindrical member 36 to the position shown in FIG. 2A proximate to susceptor 12, by again supplying compressed air to chamber 58 through inlet 62 to expand bellows 56. As shown, when pickup surface 68 of the fixture 32 has completed its approach to susceptor 12, pins 70, which serve to keep semiconductor wafer 10 in proper position beneath pickup surface 68, retract as shown, thus preventing damage to graphite susceptor 12. In picking up a semiconductor wafer 10, should the wafer 10 be positioned off center beneath the pickup surface 68 and one or more of the pins 70 impinge against it, the pins 70 also retract in that case, thus only gently contacting wafer 10 and thereby preventing significant damage to it. When the pickup fixture has been positioned slightly above susceptor 12 as shown in FIG. 2A, gas flow through inlet 62 is terminated, and the semiconductor wafer 10 settles into recess 49, as shown. Returning the semiconductor wafer 10 to air slide 16 in FIG. 1 from susceptor 12 may be accomplished by reversing the operations described above.

It should now be apparent that a fixture and system for handling plate like objects, such as semiconductor wafers, capable of achieving the stated objects of the invention, has been provided. The fixture and system allows ready transfer of a semiconductor wafer from an air slide or other conveying means to a desired location, such as a carrier suitable for use in batch processing equipment, and subsequent return of the wafer from such a carrier to the air slide or other conveyer, all of an automated basis without damage to the wafer.

While the invention has been particularly shown and described with reference to a preferred embodiment thereof, it will be understood by those skilled in the art that various changes in the form and details may be made therein without departing from the spirit and scope of the invention. For example, a plurality of the pickup fixtures 32 could be mounted on the support arm 36 in ganged fashion to allow simultaneous pick up of semiconductor wafers from a plurality of pickup stations 18 and simultaneous delivery of them to a plurality of rows of recesses 49 in the susceptor 12.

What is claimed is:

1. An apparatus for handling plate like objects, which comprises:
   1. a gas actuated fixture having a surface for releasably picking up the plate like objects utilizing the Bernouilli effect,
   2. means for moving said pickup fixture in a plane of motion from a first to a second position,
   3. means forming a part of said pickup fixture for moving the pickup surface orthogonally to the plane of motion, and
   4. a plurality of retractable members extending from the pickup surface of the device and enclosing an area of the surface of the pickup device, said retractable members serving to confine a plate like object picked up with said apparatus to the area so enclosed, and said retractable members retracting in response to force applied to them orthogonally to said pickup surface, thereby preventing damage to a plate like object or a support for a plate like object applying such a force to said retractable members.

2. A system for handling plate like objects, which comprises:
   1. the apparatus of claim 1,
   2. a conveyer for the plate like objects, said conveyer including means for restraining the objects beneath the first position, and
   3. means for positioning successive locations of a carrier for the plate like objects beneath the second position.

3. The apparatus of claim 1 in which said means for moving the pickup surface is pneumatically operated.

4. The apparatus of claim 3 in which said pneumatically operated means for moving the pickup surface comprises a bellows.

5. The apparatus of claim 1 in which the plate like objects are semiconductor wafers.

6. An apparatus for handling plate like objects, which comprises:
   1. a gas actuated device having a surface for releasably picking up the plate like objects,
   2. means for moving said pickup device from a first to a second position, and
   3. a plurality of retractable members extending from the pickup surface of the device and surrounding an area of the pickup surface of the device, the area being dimensioned to receive one of the plate like objects, said retractable members serving to confine a plate like object picked up with said apparatus to the area so enclosed, said retractable members retracting in response to force applied to them orthogonally to said pickup surface, thereby preventing damage to a plate-like object or a support for a plate-like object applying such a force to said retractable members.

7. The apparatus of claim 6 additionally comprising:
   4. means forming a part of said pickup device for moving the pickup surface orthogonal to a plane of motion defined by operation of said means for moving said pickup device.

8. The apparatus of claim 7 in which said means for moving the pickup surface is pneumatically operated.

9. The apparatus of claim 8 in which said pneumatically operated means for moving the pickup surface comprises a bellows.

10. The apparatus of claim 6 in which the plate like objects are semiconductor wafers.

11. A system for handling plate like objects which comprises:
    1. an apparatus for handling plate like objects comprising:
       a. a Bernoulli fixture having a surface for picking up the plate like objects,
       b. means for moving said Bernoulli fixture in a plane of motion from a first to a second position,
       c. pneumatically operated means forming a part of said Bernoulli fixture for moving the pickup surface orthogonally to the plane of motion, and
       d. stop means for limiting the movement of the pick up surface to a predetermined distance from the plane of motion,
    2. an air track conveyer for the plate like objects, said conveyer including means for restraining the objects beneath the first position, and
    3. means for positioning successive locations of a carrier for the plate like objects beneath the second position.

12. The system of claim 11 in which the plate like objects are semiconductor wafers.

13. The system of claim 11 additionally comprising:
    4. a plurality of retractable members extending from the pickup surface of the apparatus for handling plate like objects and enclosing an area of the surface.

14. A system for handling semiconductor wafers, which comprises:
    1. a fixture for picking up semiconductor wafers, which comprises:
       a. upper and lower members, said lower member having a lower flat surface;
       b. a bellows joining said upper and lower members, said bellows, upper and lower members forming a fluid tight enclosure;
       c. means communicating with the enclosure for selectively supplying a fluid under pressure to the enclosure; and
       d. means, extending through said lower member, for supplying a sufficient gas flow to the lower flat surface of said lower member, so that said fixture will pick up one of the semiconductor wafers positioned proximate to the lower surface of said lower member when the gas flows around the semiconductor wafer,
    2. an air slide conveyer for the semiconductor wafers,
    3. means on said air slide conveyer for stopping one of the semiconductor wafers at a first location,
    4. means to one side of said air slide conveyer for successively positioning wafer receiving locations of a flat member at a second location; and
    5. means for moving said fixture between a position over the first location and a position over the second location.

15. The system of claim 14 in which said flat member is a graphite susceptor having an upper surface with a plurality of recesses, each recess being dimensioned to receive one of the semiconductor wafers.

* * * * *